United States Patent
Liu et al.

(10) Patent No.: US 9,999,167 B2
(45) Date of Patent: Jun. 12, 2018

(54) REMOVING APPARATUS

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Yu-Ching Liu, New Taipei (TW); Fu-Chi Yang, New Taipei (TW); Jin-Song Zheng, Shenzhen (CN); Jing-Bin Liang, Shenzhen (CN); Hai-Gui Huang, Shenzhen (CN); Qin-Xian Yi, Shenzhen (CN); Ji-Ke Shan, Shenzhen (CN); Xue-Wu Mo, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 474 days.

(21) Appl. No.: 14/714,011

(22) Filed: May 15, 2015

(65) Prior Publication Data

US 2016/0218492 A1     Jul. 28, 2016

(30) Foreign Application Priority Data

Jan. 23, 2015  (CN) .......................... 2015 1 0034614

(51) Int. Cl.
  *B23P 19/00*  (2006.01)
  *H05K 13/00*  (2006.01)
  *H05K 13/04*  (2006.01)

(52) U.S. Cl.
  CPC ......... *H05K 13/00* (2013.01); *H05K 13/0486* (2013.01); *Y10T 29/53274* (2015.01)

(58) Field of Classification Search
  CPC .... H05K 13/00; H05K 13/0486; B26D 1/065; B26D 5/0082; Y10T 29/53274; Y10T 29/534
  USPC ........................ 29/846, 709, 762, 791; 83/35
  See application file for complete search history.

(56) References Cited

U.S. PATENT DOCUMENTS 6,070,322 A * 6/2000 Case ...................... B26D 1/065
                                                      29/846
2002/0185121 A1* 12/2002 Farnworth ........... B28D 5/0082
                                                        83/35

* cited by examiner

Primary Examiner — Donghai D Nguyen
(74) Attorney, Agent, or Firm — ScienBiziP, P.C.

(57) ABSTRACT

An apparatus for removing cables is provided. The apparatus includes a worktable. An upper surface of the worktable is used to fix at least one motherboard separately. Each motherboard includes a cable fixed thereon. The apparatus includes a feeding assembly, a driving assembly and a removing assembly. The driving assembly and the removing assembly are located on the feeding assembly. The feeding assembly is used to drive the driving assembly and the removing assembly to move to a pre-defined position. The driving assembly is used to drive the removing assembly to remove the cable from the motherboard.

10 Claims, 10 Drawing Sheets

REMOVING APPARATUS

FIELD

The subject matter herein generally relates to removing apparatuses, and especially to a removing apparatus which can remove the cables located on the print circuit board semi-automatically.

BACKGROUND

The electronic product includes a motherboard and a cable welded on the motherboard thereof. When the electronic product is broken, the cable should be removed firstly, and then the electronic product can be repaired. However, the cable cannot be easily removed from the motherboard.

BRIEF DESCRIPTION OF THE DRAWINGS

Many aspects of the present disclosure are better understood with reference to the follow drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
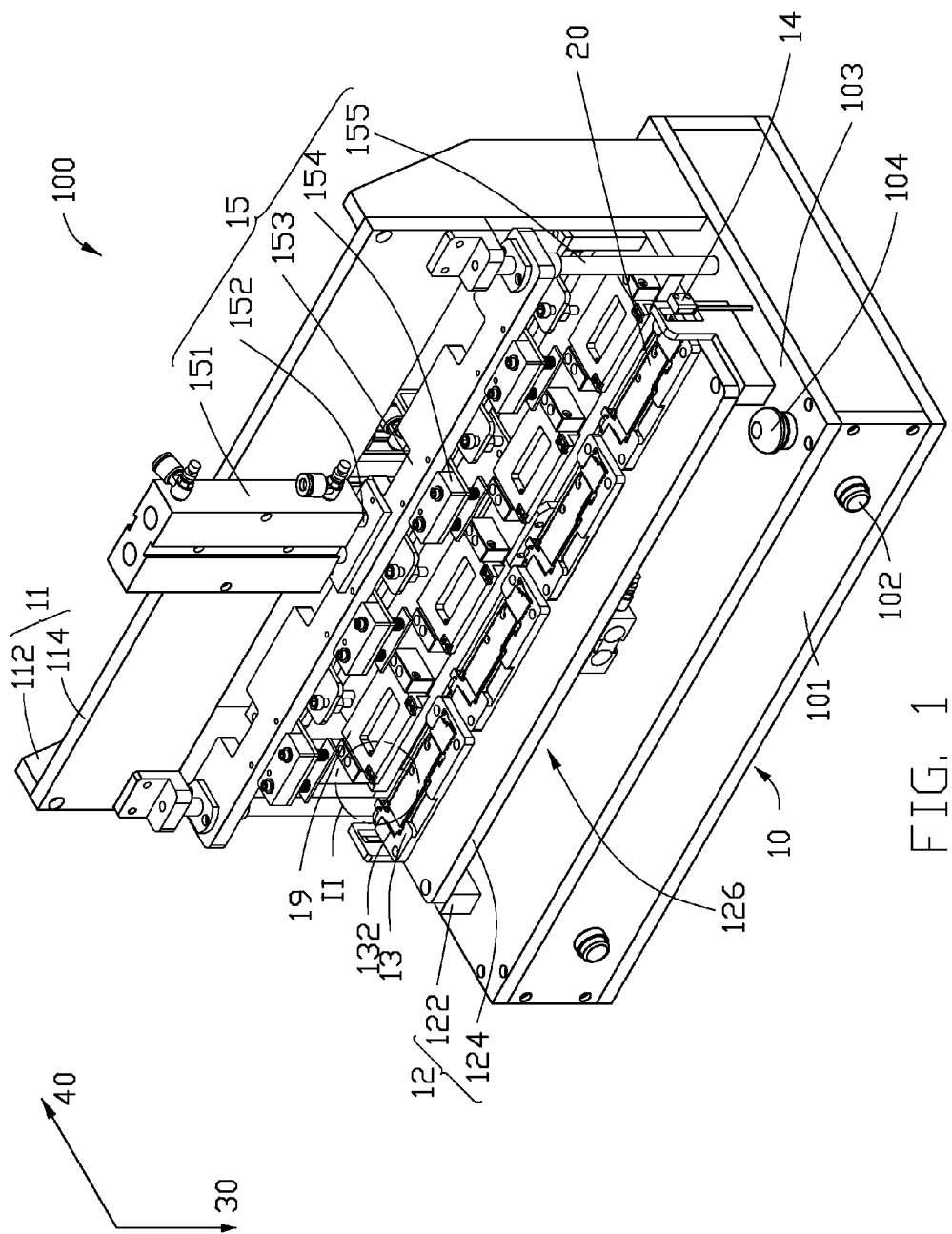
FIG. 1 is an isometric view of an embodiment of a removing apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series and the like.

Referring to FIGS. 1-4, the removing apparatus 100 can include a worktable 10, a first supporting bracket 11, a second supporting bracket 12, at least one tray 13, a sensing member 14, a holding assembly 15, a feeding assembly 16, at least one spacing assembly 17, a driving assembly 18 and a removing assembly 19.

The worktable 10 can be substantially rectangular-hollow shaped. The worktable 10 can include a front surface 101 and an upper surface 103 coupling with the front surface 101. The worktable 10 can have a double control button 102 located on the front surface 101. The worktable 10 can further have an emergency button 104 located on the upper surface 103. The worktable 10 can further have a controller (not shown) located therein. The controller can be used to control the movement of the sensing member 14, the holding assembly 15, the feeding assembly 16, the driving assembly 18 and the removing assembly 19. The worktable 10 can further have a control circuit (not shown) electrically coupled to the double control button 102 and a control circuit (not shown) electrically coupled to the emergency button 104.

The first supporting bracket 11 can be substantially U-shaped. The first supporting bracket 11 can be mounted on one side of the upper surface 103 away from the front surface 101. The first supporting bracket 11 can include two first vertical plates 112 and a second vertical plate 114. The two first vertical plates 112 can be parallel with each other and further mounted on the upper surface 103 separately. The second vertical plate 114 can couple between the two first vertical plates 112. The second vertical plate 114 can be parallel with the front surface 101 and further perpendicular to the upper surface 103.

The second supporting bracket 12 can be substantially U-shaped. The height of the second supporting bracket 12 is lower than the height of the first supporting bracket 11. The second supporting bracket 12 can be mounted on one side of the upper surface 103 of the worktable 10 close to the front surface 101. The second supporting bracket 12 can include two third vertical plates 122 and a first supporting plate 124. The two third vertical plates 122 can be parallel with each other and further mounted on the upper surface 103 separately. The first supporting plate 124 can couple between the two third vertical plates 122. The third vertical plate 122, the first supporting plate 124 and the upper surface 103 can cooperatively form a receiving space 126.

Figure 2:
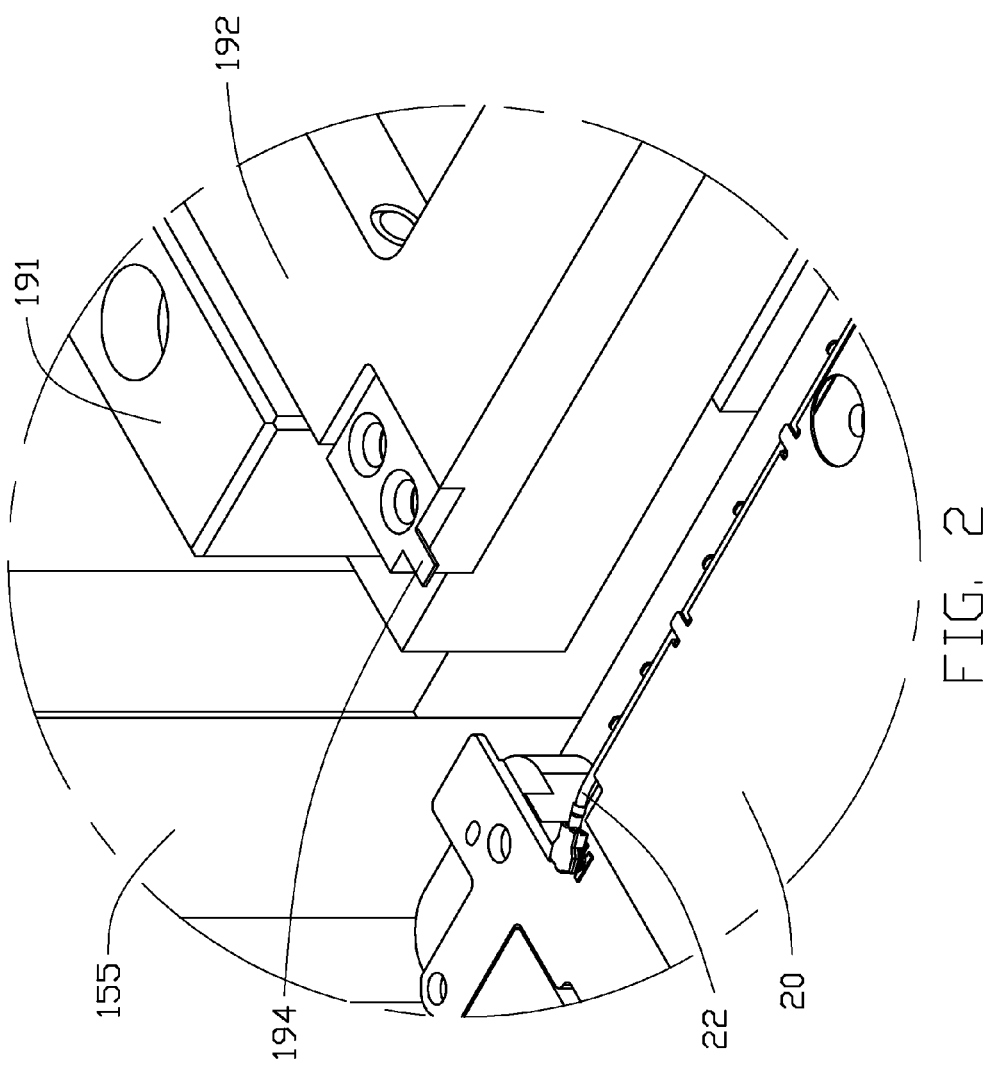
FIG. 2 is an enlarged view of circle II of the embodiment of the removing apparatus shown in FIG. 1.
Figure 3:
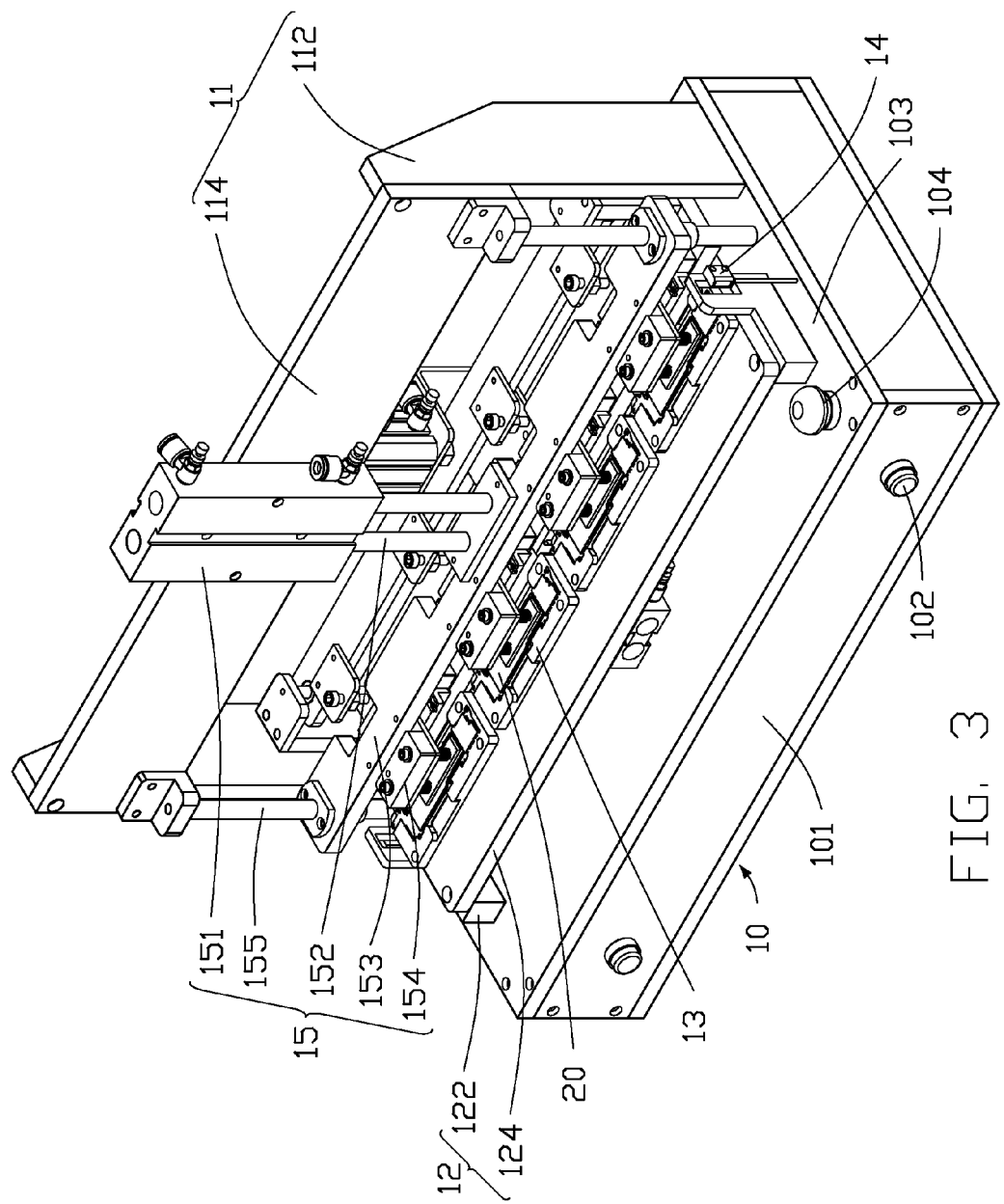
FIG. 3 is an isometric view of an embodiment of the removing apparatus shown in FIG. 1 in a first state.
Figure 4:
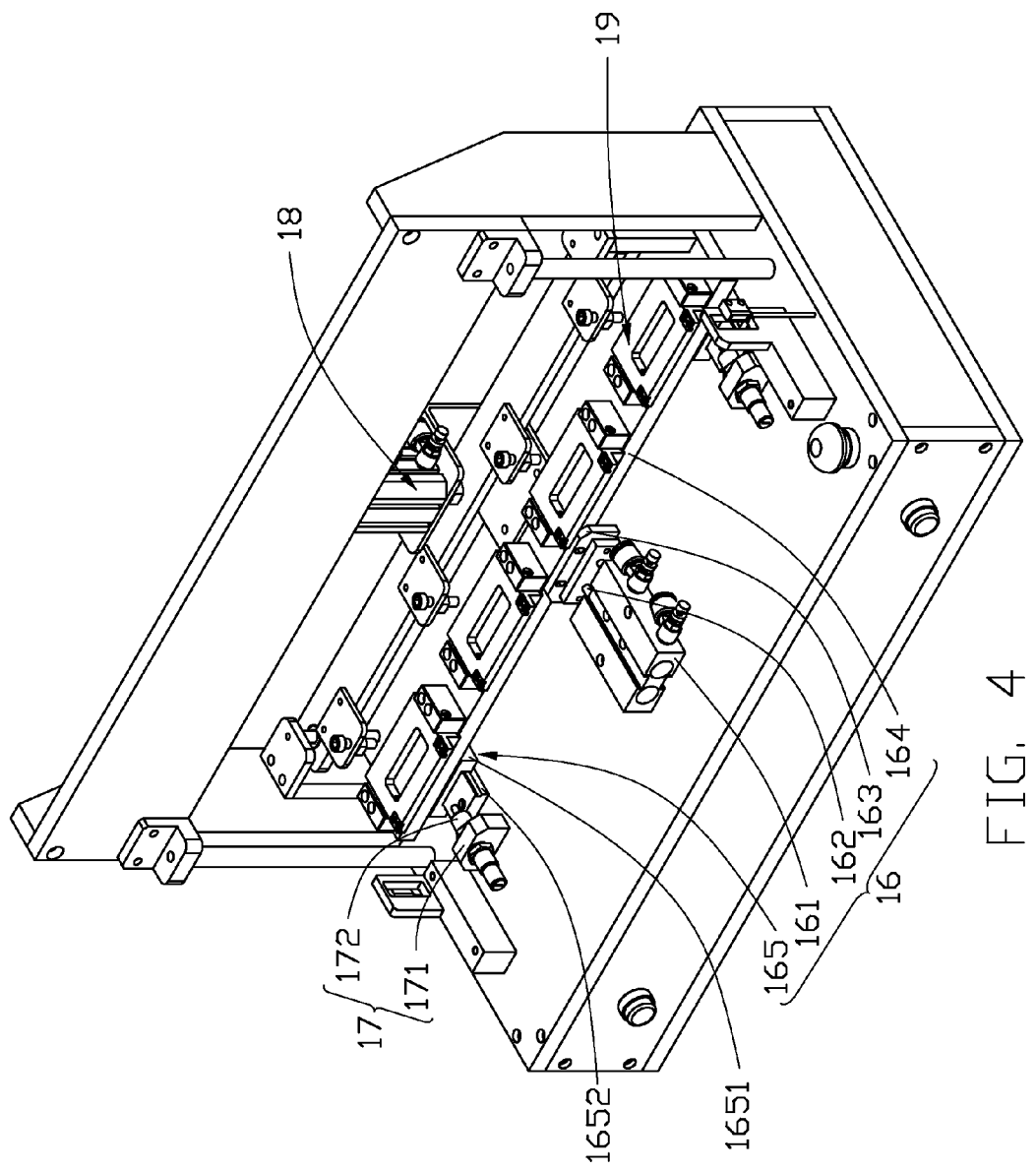
FIG. 4 is a partial isometric view of an embodiment of the removing apparatus shown in FIG. 1.

The at least one tray 13 can be mounted on the first supporting plate 124. In this embodiment, the number of trays 13 can be mounted on the first supporting plate 124 separately. The arrange direction of the trays 13 can be parallel with the length direction of the first supporting plate 124. Each tray 13 can define an accommodating space 132 for accommodating a motherboard 20. The shape of the accommodating space 132 can be matched with the shape of the motherboard 20. In at least one embodiment, the tray 13 can be only one. Referring to FIG. 2, the motherboard 20 can include a cable 22, and the two ends of the cable 22 can be welded on the motherboard 20.

Referring to FIGS. 1-4, the sensing member 14 can include two flatness sensors (one flatness sensor is not shown). The two flatness sensors can be opposite to each other. Each flatness sensor can be mounted on one of the two third vertical plates 122. When the light from one flatness sensor can be received by the other flatness, it is indicated that the position of the motherboard 20 is right. When the light from the one flatness sensor cannot be received by the other flatness sensor, it is indicated that the position of the motherboard 20 is wrong. In at least one embodiment, if the position of the motherboard 20 can be always right, the sensing member 14 can be omitted accordingly.

For easy of description, the first direction 30 and the second direction 40 can be defined. The first direction 30 can be perpendicular to the upper surface 103 of the worktable 10 and parallel with the first vertical plate 112. The second direction 40 can be parallel with the upper surface 103 of the worktable 10 and perpendicular to the front surface 101.

The holding assembly 15 can be located above motherboard 20 and used to hold the motherboard 20 along the first direction 30. In detail, the holding assembly 15 can include a holding air cylinder 151, a holding pushing rod 152, a holding pushing plate 153, at least one holding resisting member 154 and at least one guiding member 155. The holding air cylinder 151 can be substantially fixed to the middle of the second vertical plate 114. The holding pushing rod 152 can protrude from one end of the holding air cylinder 151 close to the worktable 10 along the first direction 30. The holding pushing plate 153 can be fixed to one end of the holding pushing rod 152 away from the holding air cylinder 151. The holding plate 153 can be parallel with the upper surface 103 of the worktable 10. The at least one holding resisting member 154 can be parallel with the holding pushing plate 153, and the at least one holding resisting member 154 can be fixed to one side of the holding pushing plate 153 away from the second vertical plate 114 separately. When the holding air cylinder 151 drives the holding pushing rod 152 and the holding pushing plate 153 to move closer to the at least one tray 13 along the first direction 30, each holding resisting member 154 can resist one motherboard 20. The at least one holding guiding member 155 can be located on one side or two opposite sides of the holding pushing plate 153. One end of the holding guiding member 155 can be fixed on the upper surface 103, and the other end of the holding guiding member 155 can be fixed to the second vertical plate 114, and the axis of the each holding guiding member 155 can be parallel with the first direction 30. The holding pushing plate 153 can be slidably sleeved on the at least one holding guiding member 155, and the holding pushing plate 153 can slide with the guide of the at least one guiding member 155.

The number of the at least one holding resisting member 154 can be same to the number of the trays 13. Each holding resisting member 154 can be located above one of the at least one tray 13. In this embodiment, the number of the at least one holding resisting member 154 can be four. In at least one embodiment, the number of the at least one holding resisting member 154 can be defined according to need.

Figure 5:
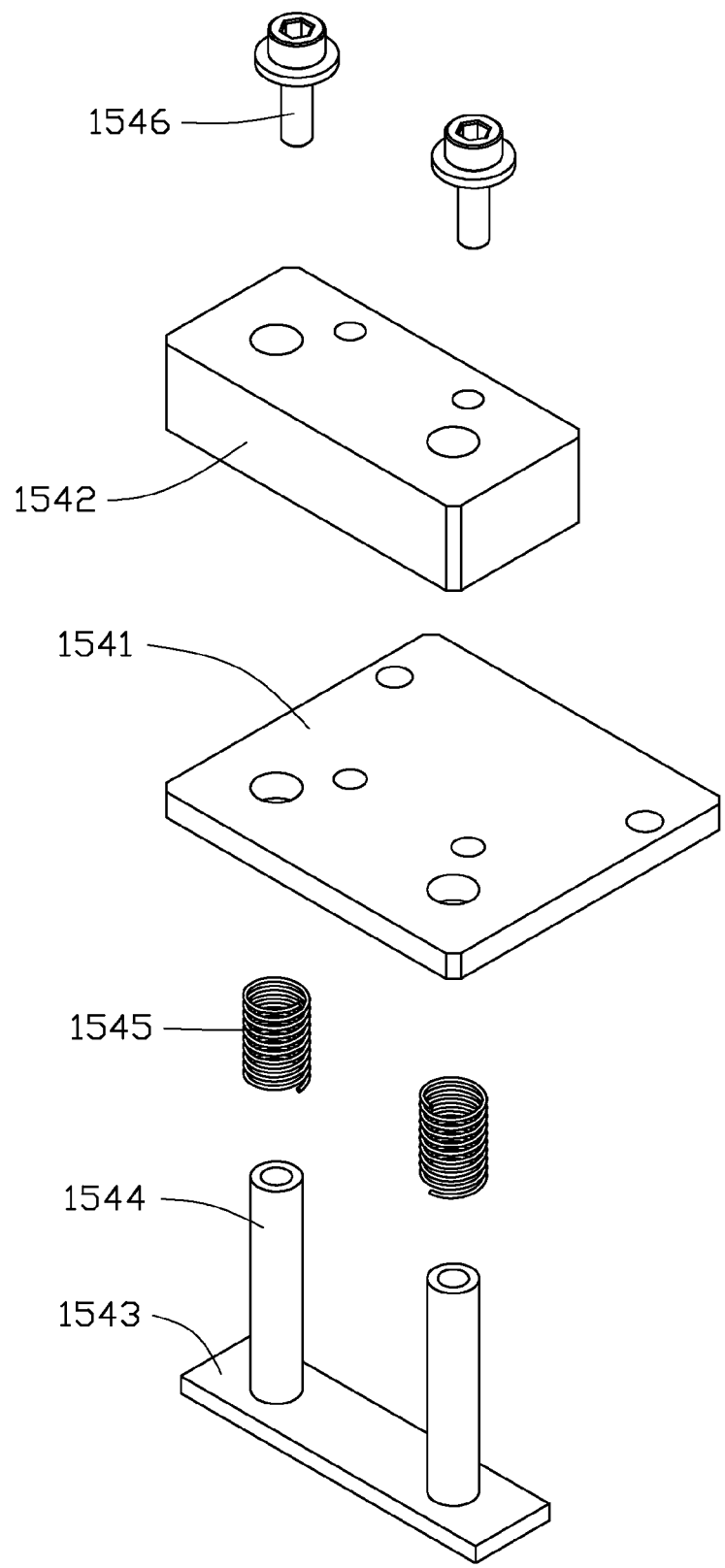
FIG. 5 is an exploded isometric view of an embodiment of a resisting member shown in FIG. 3.
Figure 6:
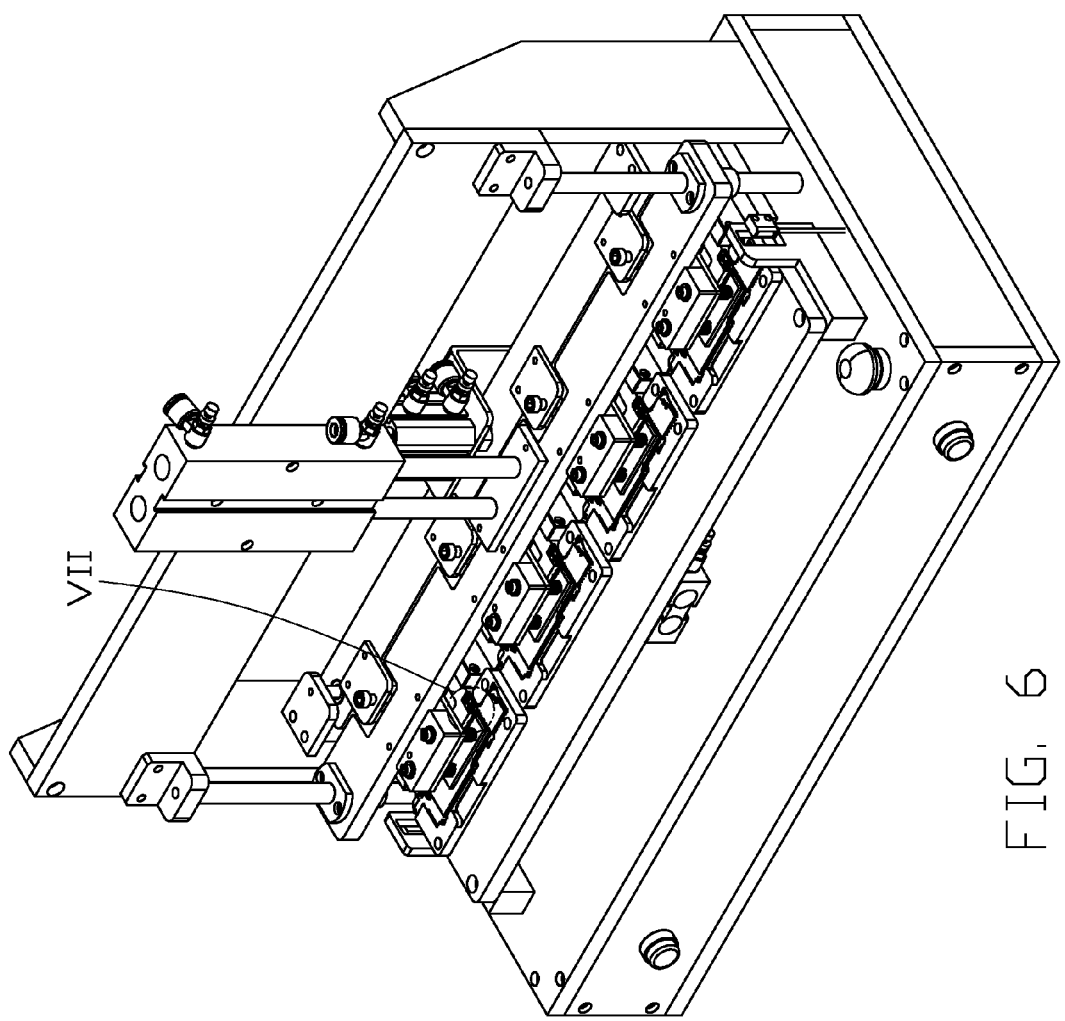
FIG. 6 is an isometric view of an embodiment of the removing apparatus shown in FIG. 1 in a second state.

Referring to FIG. 5, each holding resisting member 154 can include a connecting portion 1541, a spacer block 1542, a resisting portion 1543, at least one guiding portion 1544, at least one elastic portion 1545 and at least one limited portion 1546. The connecting portion 1541 can be coupled to the holding pushing plate 153. The spacer block 1542 can be located on the connecting portion 1541. The resisting portion 1543 can be located below the connecting portion 1541. Each guiding portion 1544 can be partially fixed to the resisting portion 1543, and partially pass through the connecting portion 1541 and the space block 1542, and then coupled with one of at least one limited portion 1546. Each elastic portion 1545 can sleeve on one of the at least one guiding portion 1544, and be further located between the connecting portion 1541 and the resisting portion 1543, and further resist the resisting portion 1543. In this embodiment, the number of the at least one guiding portion 1544, the at least one elastic portion 1545 and the at least one limited portion 1546 can be both two. In at least one embodiment, the number of the at least one guiding portion 1544, the at least one elastic portion 1545 and the at least one limited portion 1546 can be but not limited two. In at least one embodiment, if the thickness of the connecting portion 1541 can be enough, and the spacer block 1542 can be omitted accordingly.

In this embodiment, the number of the at least one holding guiding member 155 can be two. The two holding guiding members 155 can be located on two sides of the holding pushing plate 153. In at least one embodiment, the number of the at least one guiding member 155 can be defined according to need. In at least one embodiment, the holding guiding member 155 can be other forms, such as a guiding rail is engaged with a guide groove.

In at least one embodiment, if the motherboard 20 can be fixed to the tray 13 directly, the first supporting bracket 11 and the holding assembly 15 can be omitted accordingly.

Referring to FIGS. 1, 4, 6 and 7, the feeding assembly 16 can be used to drive the removing assembly 19 to move closer to the motherboard 20 or move away from the motherboard 20 along the second direction 40. The second feed assembly 16 can include a feeding air cylinder 161, a feeding pushing rod 162, a feeding pushing plate 163, a feeding supporting plate 164 and at least one feeding guiding member 165. The feeding air cylinder 161 can be fixed on the upper surface 103 and further received in the receiving space 126. The feeding pushing rod 162 can be protruded from one end of the feeding air cylinder 161 away from the front surface 101 of the worktable 10. The axis of the feeding pushing rod 162 can be parallel with the second direction 40. The feeding pushing plate 163 can be fixed to one end of the feeding pushing rod 162 away from the feeding air cylinder 161, and further parallel with upper surface 103 of the worktable 10. Each feeding guiding member 165 can include a guiding rail 1651 and a guide groove 1652. The guiding rail 1651 can be fixed to one side of the supporting plate 164 close to the worktable 10. The guide groove 1652 can be fixed to the upper surface 103 of the worktable 10. The guiding rail 1651 can engage with the guide groove 1652, and further slide relative to the guide groove 1652 with the guide of the guide groove 1652. The sliding direction of the guiding rail 1651 relative to the guide groove 1652 can be parallel with the second direction 40. In this embodiment, the number of the at least one feeding guiding member 165 can be two. In at least one embodiment, the number of the at least one feeding guiding member 165 can be but not limited two. In at least one embodiment, the feeding guiding member 165 can be other forms, such as a guiding rod is engaged with a guide groove.

In at least one embodiment, if the feeding pushing rod 162 can be coupled to the feeding supporting plate 164 directly, and the feeding pushing plate 163 can be omitted accordingly.

In at least one embodiment, the feeding air cylinder 161, the feeding pushing rod 162 and the feeding pushing plate 163 can be located on one side of the supporting plate 164 away from the front surface 101, and the second supporting bracket 12 can be omitted accordingly, and the at least tray 13 can be fixed to the upper surface 103 of the worktable 10. In at least one embodiment, if the at least one motherboard 20 can be fixed to the upper surface 103 of the worktable 10, the at least one tray 13 can be omitted.

The at least one spacing assembly 17 can be partially received in the receiving space 126. The at least one spacing assembly 17 can be used to space the movement of the guiding rail 1651 along the second direction 40. In detail, the spacing assembly 17 can include a fixed block 171 and a stopped block 172 fixed to the fixed block 171. When the guiding rail 1651 is moving close to the stopped block 172, the stopped block 172 can be used to stop the guiding rail 1651, such that the feeding supporting plate 164 and the removing assembly 19 can be stopped. When the guiding rail 1651 resists the stopped block 172, each removing assembly 19 can be corresponding to one tray 13. In this embodiment, the at least one spacing assembly 17 can be two. The two spacing assemblies 17 can be located on two sides of the feeding air cylinder 161. In at least one embodiment, the spacing assembly 17 can be one L-shaped spacing post located on one side of the guiding rail 1651 or two L-shaped spacing posts located on two sides of the guiding rail 1651, and one end of the spacing post can be fixed to the upper surface 103 of the worktable 10, and the other end of the spacing post can be located above the guide groove 1652. In at least one embodiment, the spacing assembly 17 can be other forms. In at least one embodiment, if the feeding assembly 16 can be stopped to a predefined position preciously, and the at least one spacing assembly 17 can be omitted accordingly.

Figure 7:
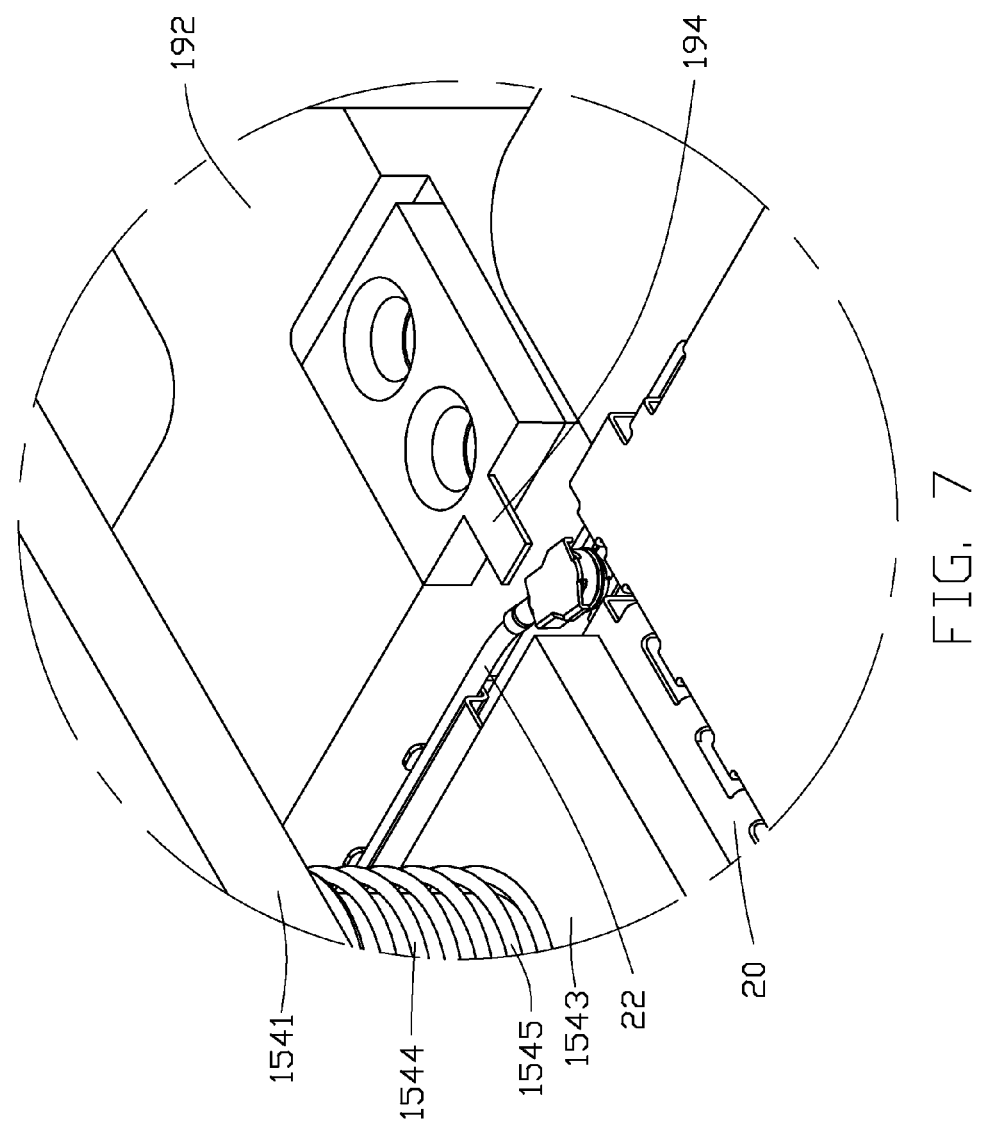
FIG. 7 is an enlarged view of circle VII of the embodiment of the removing apparatus shown in FIG. 6.
Figure 8:
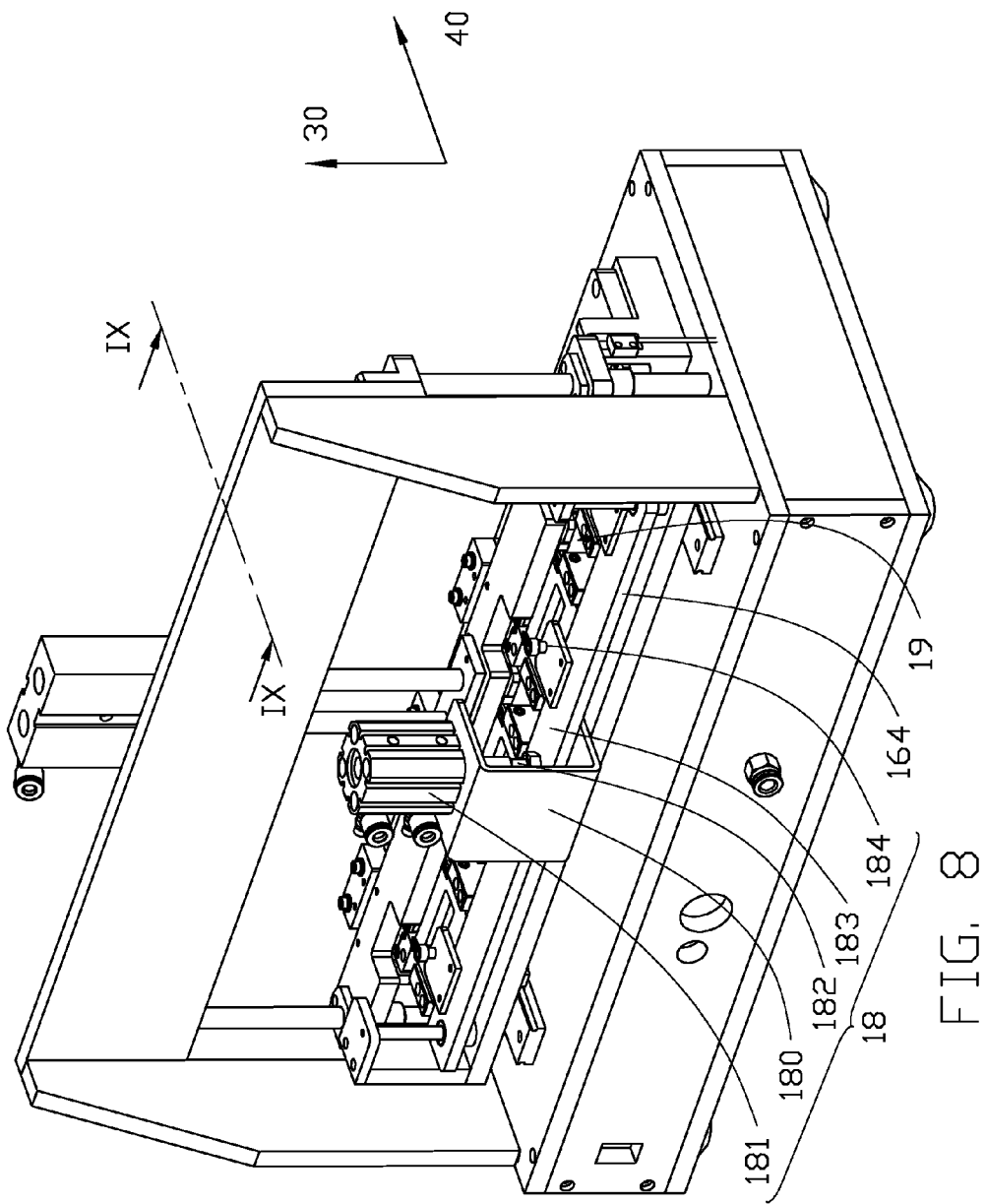
FIG. 8 is an isometric view of an embodiment of the removing apparatus shown in FIG. 1 in a third state.

Referring to FIGS. 7 and 8, the driving assembly 18 can be fixed to the feeding supporting plate 164. The driving assembly 18 can be used to drive the removing assembly 19 to remove the cable 22 from the motherboard 20. In detail, the driving assembly 18 can include a U-shaped fixed plate 180, a driving air cylinder 181, a driving pushing rod 182, a driving pushing plate 183 and at least one driving resisting member 184. The driving air cylinder 181 can be fixed to the top end of the U-shaped fixed plate 180. The bottom end of the U-shaped fixed plate 180 can be fixed to the bottom surface of the feeding supporting plate 164. The driving pushing rod 182 can be protruded from one side of the driving air cylinder 181 close to the worktable 10 along the first direction 30. The driving pushing plate 183 can be fixed to one end of the driving pushing rod 182 away from the driving air cylinder 181. The driving pushing plate 183 can be parallel with the upper surface 103 of the worktable 10. The at least one driving resisting member 184 can be separately fixed to one side of the driving pushing plate 183 in sequence, and each driving resisting member 184 can be corresponding to one removing assembly 19.

Figure 9:
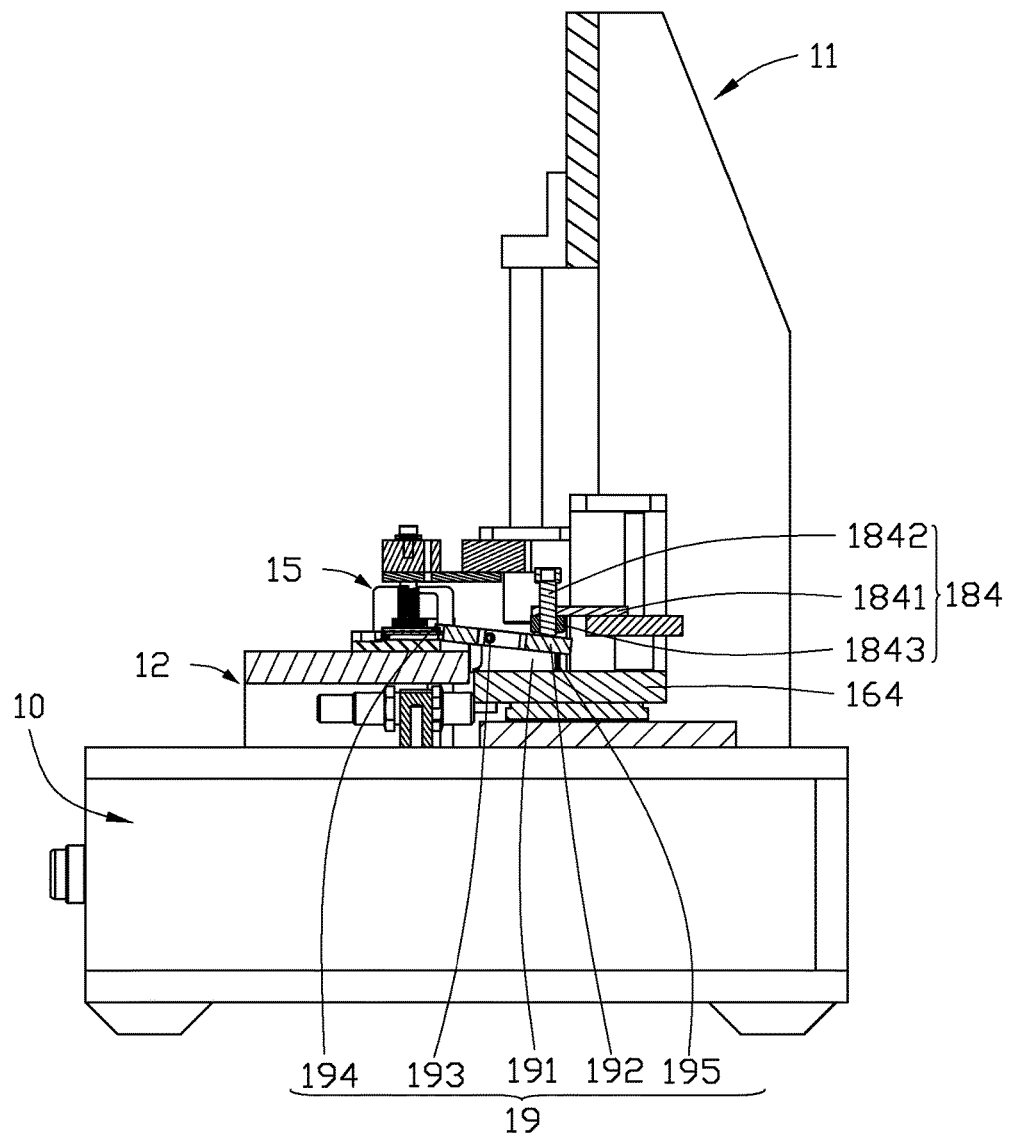
FIG. 9 is a cross-section view of an embodiment of the removing apparatus shown in FIG. 8 taken along line IX-IX.

Referring to FIG. 9, each driving resisting member 184 can include a connecting block 1841, a resisting rod 1842 and a spacing screw 1843. The connecting block 1841 can be coupled to the driving pushing plate 183, and the resisting rod 1842 can be coupled to the connecting block 1841. The spacing screw 1843 can be sleeved on the resisting rod 1842.

Figure 10:
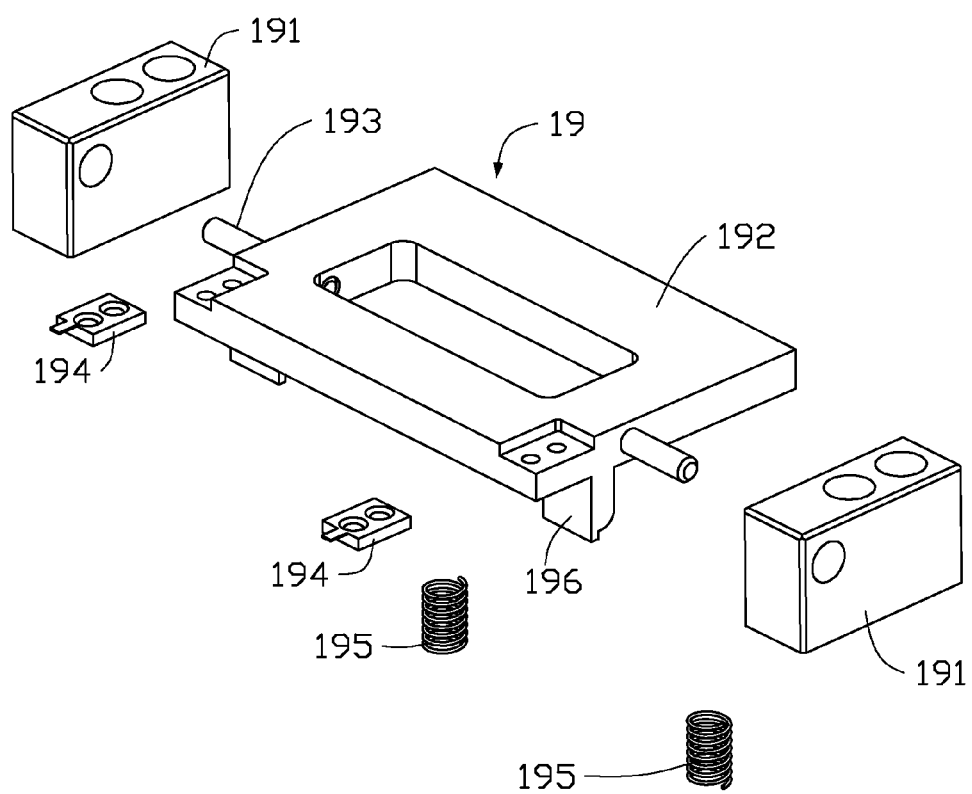
FIG. 10 is an exposed view of an embodiment of a removing assembly shown in FIG. 4.

The removing assembly 19 can be fixed to a surface of the feeding supporting plate 164 away from the worktable 10. Referring to FIGS. 7 and 10, the removing assembly 19 can include a fixed plate 191, a movable plate 192, a pivot 193, two knives 194 and an elastic resetting member 195. The fixed plate 191 can be fixed to the feeding supporting plate 164. The movable plate 192 can be rotatably attached to one side of the fixed plate 191 close to the motherboard 20 via the pivot 193. The elastic resetting member 195 can be located between the movable plate 192 and the feeding supporting plate 164, and further located on one side of the movable plate 192 away from the motherboard 20. The two knives 194 can be corresponding to the two ends of the cables 22 and further located on one side of the movable plate 192 close to the motherboard 20.

In this embodiment, one side of the movable plate 192 close to the motherboard 20 can include a supporting post 196. The supporting post 196 can be used to support the movable plate 192, such that one side of the movable plate 192 cannot be close to the feeding supporting plate 164.

In at least one embodiment, if the movable plate 192 can be returned by other ways, the elastic resetting member 195 can be omitted.

Referring to FIGS. 1, 3, 4, 6 and 8, when in use, each motherboard 20 can be placed on one tray 13. The double control button 102 can be pressed to start the removing apparatus 100. The sensing member 14 can determine whether the placing position of the motherboard 20 is right. When determined that the placing position of the motherboard 20 is right, the holding air cylinder 151 can drive the holding pushing rod 152 to move, and further drive the holding pushing plate 153 and at least one holding resisting member 154 to move close to the motherboard 20 along the first direction 30 with the guide of the at least holding guiding member 155, such that each holding resisting plate 154 can resist one motherboard 20; the feeding air cylinder 161 can drive the feeding pushing rod 162, the feeding pushing plate 163, the feeding supporting plate 164 and the driving assembly 18 located on the feeding supporting plate 164 to move close to the motherboard 20 along the second direction 40 with the guide of the at least one feeding guiding member 165, such that the at least one feeding guiding member 165 can be stopped by the spacing assembly 17, and each knife 194 can be corresponding to one end of the cable 22, and further cut the cable 22 from the motherboard 20; the driving air cylinder 181 can drive the driving pushing rod 182, the driving pushing plate 183 and the driving resisting member 184 to move along the first direction 30, such that one side of the movable plate 192 away from the motherboard 20 can move close to the feeding supporting plate 164 and the elastic resetting member 195 can be compressed by the movable plate 192, and the other side of the movable plate 192 close to the motherboard 20 can move away from the feeding supporting plate 164, and the cable 22 can be thus cocked up from the motherboard 20 by the knives 194 while the other side of the movable plate 192 close to the motherboard 20 is moving away from the feeding supporting plate 164. The driving assembly 18, the feeding assembly 16 and the holding assembly 15 can thus return their initial positions. The removing assembly 19 can thus return its initial position with the help of the elastic resetting member 195.

In at least one embodiment, the number of the tray 13, the holding resisting member 154, a driving resisting member 184 and the removing assembly 19 can be same.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A removing apparatus comprising:
 a worktable having an upper surface configured to fix at least one motherboard thereon, each motherboard having a cable welded thereon;
 a feeding assembly comprising a feeding air cylinder fixed on the upper surface, a feeding pushing rod and a feeding supporting plate, the feeding pushing rod protruding from the feeding air cylinder and coupling with the feeding supporting plate;
 a driving assembly comprising a driving air cylinder fixed above the feeding supporting plate, a driving pushing rod, a driving pushing plate and at least one driving resisting member, the driving pushing rod protruding from the driving air cylinder and coupling with the driving pushing plate, the at least one driving resisting member separately fixed to the driving pushing plate in sequence; and
 at least one removing assembly, wherein each removing assembly is corresponding to one of the at least one motherboard, each removing assembly comprises two parallel lateral plates, a movable plate and two knives, the two parallel lateral plates are fixed to the feeding supporting plate separately, the movable plate rotatably couples between the two parallel lateral plates, and the two knives are fixed to one side of the movable plate close to the at least one motherboard and further corresponding to two ends of the cable;
 wherein the feeding supporting plate is driven to move close to the at least one motherboard to a predefined position by the feeding air cylinder, each two knives cut the two ends of the cable welded on the one of the at least one motherboard, the at least one driving resisting member is driven to move close to the at least one motherboard and further resist the movable plate by the driving air cylinder, such that the side of each movable plate moves away from the feeding supporting plate, and the cable is cocked up from the one of the at least one motherboard by the two knives.

2. The removing apparatus of claim 1, wherein each driving resisting member comprises a connecting block, a resisting rod and a spacing screw, each connecting block is coupled to the driving pushing plate, the resisting rod passes through the connecting block, the spacing screw is coupled to the resisting pushing rod and further resists the connecting block, such that the resisting rod is capable of being stopped by the spacing screw.

3. The removing apparatus of claim 1, wherein the feeding assembly further comprises at least one feeding guiding member, each feeding guiding member comprises a guiding rail and a guide groove, the guiding rail is fixed to the feeding supporting plate, the guide groove is fixed to the upper surface, the guiding rail is engaged with the guide groove, the feeding supporting plate moves close to or away from the at least one motherboard with the guide of the guiding rail and the guide groove.

4. The removing apparatus of claim 3, wherein the removing apparatus further comprises at least one spacing assembly, each spacing assembly comprises a fixed block and a stopped block fixed on the fixed block, when the guiding rail moves close to the stopped block, the stopped block is capable of stopping the guiding rail, the feeding supporting plate and the removing assembly located on the feeding supporting plate.

5. The removing apparatus of claim 1, wherein the removing apparatus further comprises a first supporting bracket and a holding assembly, the first supporting bracket comprises two first vertical plates and a second vertical plate, the two first vertical plates are parallel with each other and fixed to the upper surface separately, the second vertical plate are coupled between the two first vertical plates, the holding assembly comprises a holding air cylinder, a holding pushing rod, a holding pushing plate and at least one holding resisting member, the holding air cylinder is fixed to the second vertical plate, the holding pushing rod is protruded from the holding air cylinder and coupled with the holding pushing plate, the at least one holding resisting member is separately fixed to the holding pushing plate; when the holding air cylinder drives the holding pushing rod and the holding pushing plate to move close to the at least one motherboard, each holding resisting member resists the one of the at least one motherboard.

6. The removing apparatus of claim 5, wherein the holding assembly comprises at least one holding guiding member, the at least one holding guiding member couples between the upper surface and the second vertical plate, the holding pushing plate is slidably sleeved on the at least one holding guiding member, the holding pushing plate is capable of sliding with the guide of the at least one holding guiding member.

7. The removing apparatus of claim 5, wherein the holding resisting member comprises a connecting portion, a resisting portion, at least one guiding portion and at least one limited portion, the connecting portion is fixed to the holding pushing plate, the resisting portion is located below the connecting portion, each guiding portion is partially fixed to the resisting portion, and partially pass through the connecting portion, and further coupled with the at least one limited portion.

8. The removing apparatus of claim 1, wherein the removing apparatus further comprises:
 a second supporting bracket, the second supporting bracket comprises two third vertical plates located on two sides of the at least one motherboard; and
 two flatness sensors, each flatness sensor is fixed to one of the two third vertical plates; when the light from one flatness sensor is received be the other flatness sensor, it is indicated that the position of the at least one motherboard is right; when the light from the one flatness sensor cannot be received by the other flatness sensor, it is indicated that the position of the at least one motherboard is wrong.

9. The removing apparatus of claim 1, wherein the removing apparatus further comprises:
 a second supporting bracket comprising two third vertical plates and a first supporting plate, wherein the two third vertical plates are parallel with each other and further fixed to the upper surface separately, the first supporting plate couples the two third vertical plates; and
 at least one tray fixed on the first supporting plate separately, wherein each tray defines an accommodating space matching with one of the at least one motherboard.

10. The removing apparatus of claim 1, wherein the removing apparatus further comprises a second supporting bracket, the second supporting bracket comprises two third vertical plates and a first supporting plate, the two third vertical plates are parallel with each other and further fixed to the upper surface separately, the first supporting plate couples the two third vertical plates; the two third vertical plates, the first supporting plate and the upper surface are cooperatively form a receiving space, the feeding air cylinder is received in the receiving space, the at least one motherboard is fixed on the first supporting plate.

* * * * *